(12) United States Patent
Sakamoto

(10) Patent No.: US 10,121,835 B2
(45) Date of Patent: Nov. 6, 2018

(54) DISPLAY DEVICE

(71) Applicant: Japan Display Inc., Minato-ku (JP)

(72) Inventor: Shigeru Sakamoto, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/635,668

(22) Filed: Jun. 28, 2017

(65) Prior Publication Data

US 2018/0012945 A1  Jan. 11, 2018

(30) Foreign Application Priority Data

Jul. 5, 2016 (JP) .................................. 2016-133581

(51) Int. Cl.
*H01L 27/32* (2006.01)
*H01L 51/52* (2006.01)

(52) U.S. Cl.
CPC ...... *H01L 27/3246* (2013.01); *H01L 51/5234* (2013.01); *H01L 51/5275* (2013.01); *H01L 2251/5315* (2013.01)

(58) Field of Classification Search
None
See application file for complete search history.

(56) References Cited

U.S. PATENT DOCUMENTS

| 7,091,658 | B2* | 8/2006 | Ito | H01L 27/3246 313/504 |
| 9,318,723 | B2* | 4/2016 | Kang | H01L 51/5256 |
| 9,525,013 | B2* | 12/2016 | Xu | H01L 51/5271 |
| 2006/0082284 | A1 | 4/2006 | Shibusawa | |
| 2007/0241671 | A1* | 10/2007 | Kai | H01L 27/3246 313/504 |
| 2010/0159792 | A1* | 6/2010 | Visser | H01L 51/5234 445/58 |
| 2015/0060810 | A1* | 3/2015 | Han | H01L 27/3246 257/40 |
| 2016/0276418 | A1* | 9/2016 | Xu | H01L 51/5271 |
| 2017/0373124 | A1* | 12/2017 | Yang | H01L 27/3246 |

FOREIGN PATENT DOCUMENTS

| CN | 104037357 A | 9/2014 |
| JP | 2006-113376 | 4/2006 |
| TW | 201515209 A | 4/2015 |

OTHER PUBLICATIONS

Combined Office Action and Search Report dated Mar. 19, 2018 in Taiwanese patent Application No. 106122176 with English translation, 9 pages.

* cited by examiner

*Primary Examiner* — Joseph Schoenholtz
(74) *Attorney, Agent, or Firm* — Oblon, McClelland, Maier & Neustadt, L.L.P.

(57) ABSTRACT

To provide a display device including a pixel electrode formed on an insulating surface; a bank covering an end portion of the pixel electrode and having an opening formed therein in which the upper surface of the pixel electrode is exposed; an organic layer containing a light emitting layer and formed covering the opening; and an opposed electrode formed on the organic layer and the bank. The bank has a first layer formed on an end portion of the pixel electrode and the insulating surface, and a second layer formed on the first layer. The refractive index of the material forming the first layer is less than the refractive index of the material forming the second layer.

14 Claims, 6 Drawing Sheets

DISPLAY DEVICE

CROSS-REFERENCE TO RELATED APPLICATION

The present application claims priority from Japanese application JP2016-133581 filed on Jul. 5, 2016, the content of which is hereby incorporated by reference into this application.

BACKGROUND OF THE INVENTION

1. Field of the Invention

The present invention relates to a display device.

2. Description of the Related Art

In a display device such as an organic Electro Luminescence (EL) display device, a light-emitting element, such as an organic light emitting diode (OLED), may be controlled by using a switching element, such as a transistor, to display an image (Japanese Patent Laid-open Publication No. 2006-113376).

An organic light emitting diode emits light not only vertically but also diagonally to the display surface of a display device. The light emitted diagonally to the display surface may not be extracted to the display surface side. In such a case, the light extraction efficiency of a display device may be insufficient.

SUMMARY OF THE INVENTION

The object of the present invention is to provide a display device with improved light extraction efficiency.

A display device according to the present invention includes a pixel electrode formed on an insulating surface; a bank covering an end portion of the pixel electrode and having an opening formed therein in which an upper surface of the pixel electrode is exposed; an organic layer formed covering the opening and containing a light emitting layer; and an opposed electrode formed on the organic layer and the bank, wherein the bank has a first layer formed on an end portion of the pixel electrode and the insulating surface, and a second layer formed on the first layer, and a refractive index of material forming the first layer is less than a refractive index of material forming the second layer.

DETAILED DESCRIPTION OF THE INVENTION

Figure 1:
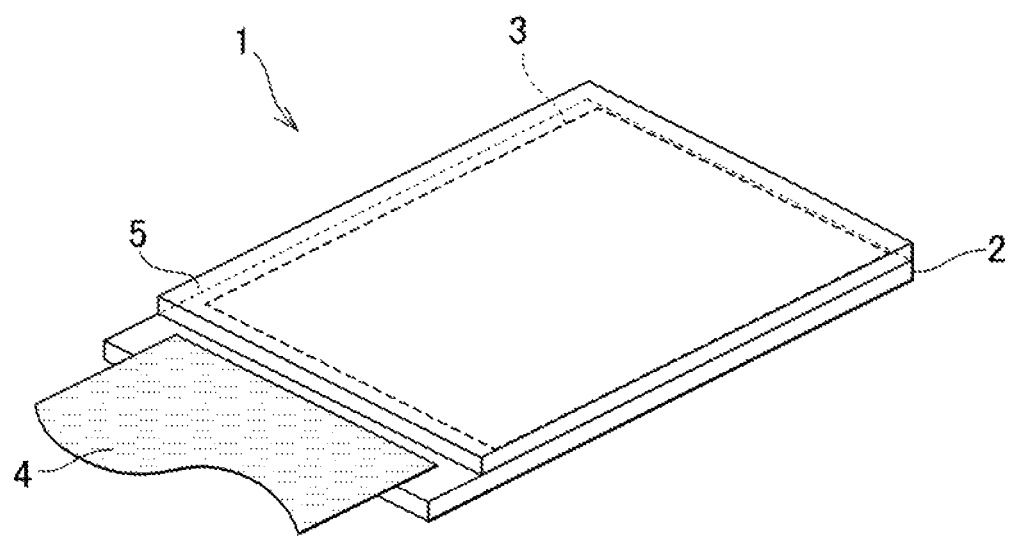
FIG. 1 is a perspective view of an organic EL display device according to an embodiment of the present invention.

The following describes respective embodiments of the present invention with reference to the drawings. The disclosure is a mere example, and naturally any modification readily conceived by a person skilled in the art without departing from the gist of the present invention will be included in the range of the present invention. The drawings may illustrate the widths, thicknesses, shapes, or the like, of the respective units more schematically for clarity of explanation as compared with actual aspects. These are mere examples, and should not limit interpretation of the present invention in any way. In this specification and respective drawings, an element similar to that which has been described earlier in connection with a drawing mentioned earlier is given the same reference numeral, and is not described again in detail.

FIG. 1 is a perspective view of an organic EL display device 1 according to an embodiment of the present invention. In the organic EL display device 1, a plurality of pixels are disposed on a display area 3 formed on a substrate 2 made of glass or flexible material. These pixels are controlled by a drive circuit (not shown), which may be formed on the substrate 2. A signal for controlling the plurality of pixels and power are inputted via a flexible print circuit (FPC) 4. The FPC 4 is crimped to and electrically connected to a terminal (not shown) formed on the substrate 2. The display area 3 may be protected by an opposed substrate 5 provided. The opposed substrate 5 may be substituted by a glass cover covering the surface of an electronic device in which the organic EL display device 1 is mounted.

Figure 2:
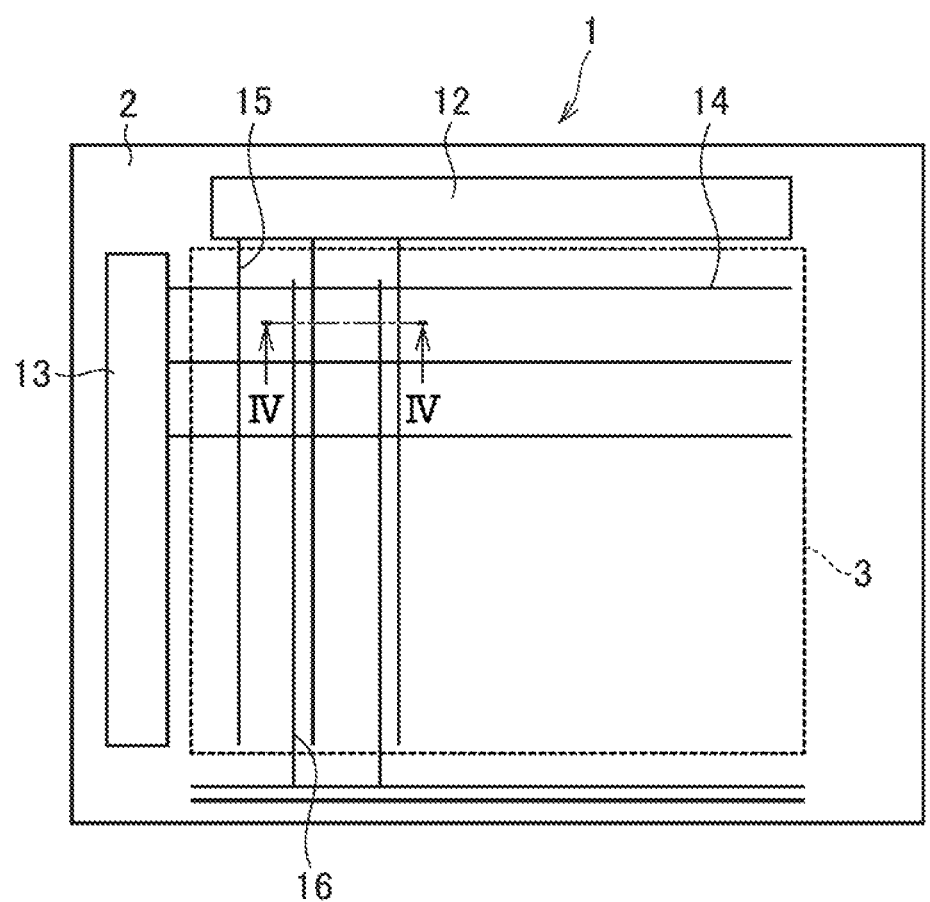
FIG. 2 is a wiring diagram of an organic EL panel according to an embodiment of the present invention.
Figure 3:
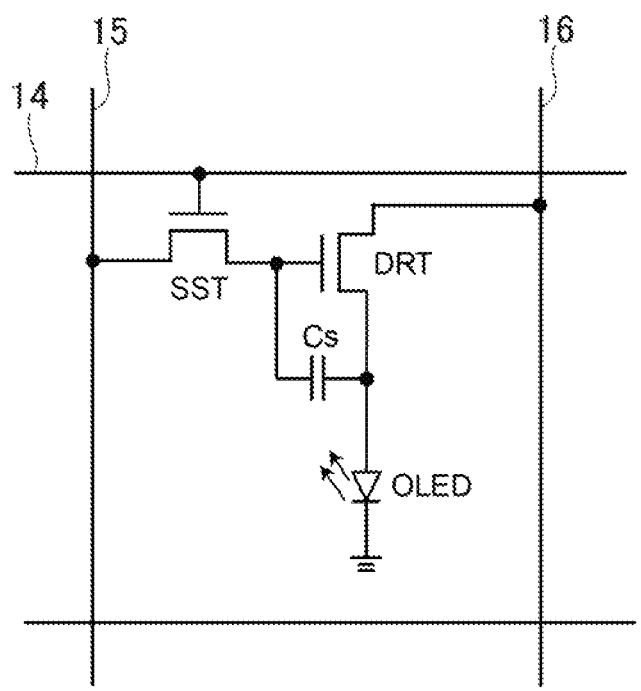
FIG. 3 is a circuit diagram of a pixel of an organic EL panel according to an embodiment of the present invention.

FIG. 2 is a plan view of the organic EL display device 1 according to an embodiment of the present invention. FIG. 3 is a circuit diagram of a pixel of the organic EL display device 1 according to an embodiment of the present invention. The organic EL display device 1 controls the respective pixels arranged in a matrix in the display area 3 on the substrate 2, using a video signal drive circuit 12 and a scan signal drive circuit 13, to display an image. The video signal drive circuit 12 is a circuit that generates a video signal to be sent to each pixel, and sends the signal. The scan signal drive circuit 13 generates a scan signal to be sent to a thin film transistor (TFT) formed in each pixel, and sends the signal. The video signal drive circuit 12 and the scan signal drive circuit 13, which are illustrated as formed in two respective positions in FIG. 2, may be formed in a single integrated circuit (IC) or formed separately in three or more positions. When the video signal drive circuit 12 and the scan signal drive circuit 13 are formed in an IC, the IC may be mounted on the substrate 2 or on the FPC shown in FIG. 1.

The signal from the scan signal drive circuit 13 is transmitted via a scan signal line 14, which is electrically connected to the gate of a pixel transistor SST formed in each pixel area. The scan signal, line 14 is common to the pixel transistors aligned in one row. The pixel transistor SST is a transistor electrically connected via its source or drain to the gate of a drive transistor DRT. The drive transistor DRT is an electric field effect transistor having an n-type channel, for example, with the source thereof electrically connected to the anode of an organic light emitting diode OLED. The cathode of the organic light emitting diode OLED is fixed at the ground potential or negative potential. In the above, a current flows from the anode to cathode in the organic light emitting diode OLED. Meanwhile, the signal from the video signal drive circuit 12 is transmitted via a video signal line 15, which is electrically connected to either the source or drain of the pixel transistor SST. The video signal line 15 is common to the pixel transistors aligned in a single column. With a scan signal applied to the scan signal line 14, the pixel transistor SST is turned on. With a video signal applied to the video signal line 15 while the pixel transistor SST is in an on state, a video signal voltage is applied to the gate of the drive transistor DRT, whereby a voltage in accordance with the video signal is written into the holding capacitor Cs, and the drive transistor DRT is turned on. Here, note that the drain of the drive transistor DRT is electrically connected to a power supply line 16, to which a power supply voltage is applied to cause the organic light emitting diode OLED to emit light. Thus, with the drive transistor DRT turned on, a current in accordance with the video signal voltage flows into the organic light emitting diode OLED, which then emits light.

Figure 4:
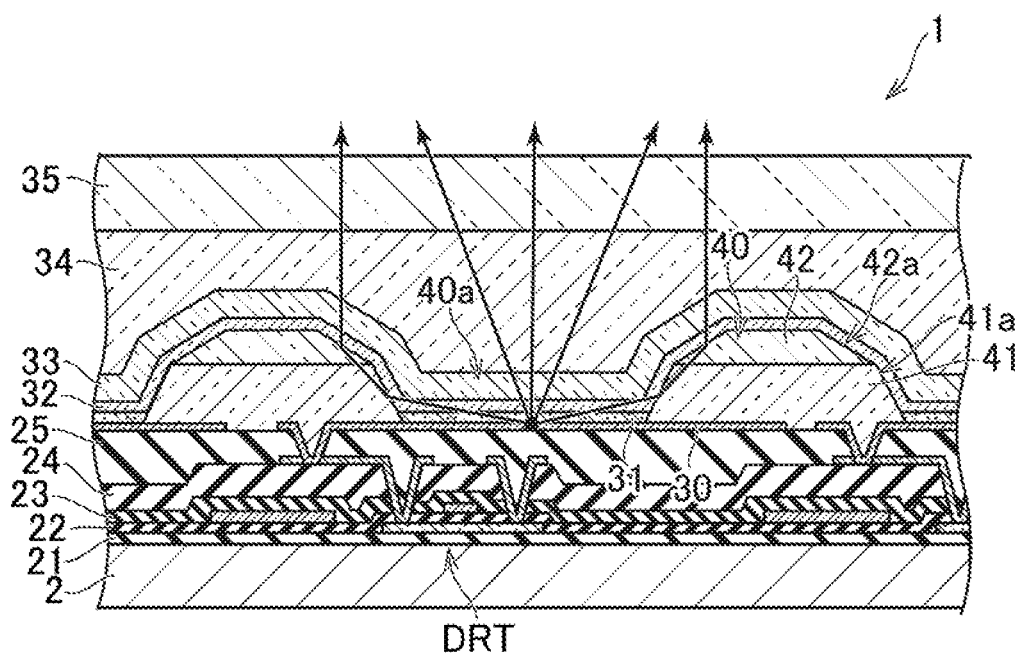
FIG. 4 is a cross sectional view of a pixel of an organic EL panel according to an embodiment of the present invention.

FIG. 4 is a cross sectional view of a pixel of the organic EL display device 1 according to an embodiment of the present invention. This drawing is a cross sectional view of a pixel along the line IV-IV shown in FIG. 2. In the organic EL display device 1 according to this embodiment, a first insulating film 21 is formed on the substrate 2, and a channel of the drive transistor DRT is formed on the first insulating film 21. A second insulating film 22 is formed on the first insulating film 21, and a gate of the drive transistor DRT is formed on the second insulating film 22. A third insulating film 23 is formed on the second insulating film 22, and a fourth insulating film 24 is formed on the third insulating film 23. Each of the second insulating film 22, the third insulating film 23, and the fourth insulating film 24 has a through-hole formed therein. In the through-hole, a source electrode and a drain electrode are formed that are electrically connected to the channel of the drive transistor DRT.

A planarization film 25 is formed on the fourth insulating film 24. In the organic EL display device 1 according to this embodiment, the planarization film 25 is made of organic insulating material and has an insulating surface. A pixel electrode 30 is formed on the upper surface of the planarization film 25. That is, the upper surface of the planarization film 25 is an insulating surface, and the pixel electrode 30 is formed on the insulating surface. A bank 40 is formed on the pixel electrode 30 and the planarization film 25. The bank 40 covers an end portion of the pixel electrode 30 and has an opening 40a formed therein where the upper surface of the pixel electrode 30 is exposed. In the opening 40a of the bank 40, an organic layer 31 including a light emitting layer is formed. The organic layer 31 is formed covering the opening 40a. An opposed electrode 32 is formed on the organic layer 31 and the bank 40. The opposed electrode 32 is made of material that passes the light emitted from the organic layer 31 therethrough. A sealing layer 33 is formed on the opposed electrode 32. A filler 34 is applied onto the sealing layer 33. An opposed substrate 35 is fixedly formed on the filler 34.

The bank 40 includes a first layer 41 formed on the end portion of the pixel electrode 30 and on the insulating surface (the surface of the planarization film 25), and a second layer 42 formed on the first layer 41. Note that the refractive index of the material forming the first layer 41 is less than that of the material forming the second layer 42. In the organic EL panel 10 according to this embodiment, the first layer 41 is made of material such as fluorine resin or silicone resin, and has a refractive index less than 1.5. Meanwhile, the second layer 42 is made of material such as polyimide resin, epoxy resin, or resin containing acrylic inorganic nanoparticles, and has a refractive index greater than 1.5 and less than 1.8. Note that the respective materials forming the first layer 41 and the second layer 42 mentioned here are mere examples, and any material that passes the light emitted from the organic layer 31 therethrough and has a refractive index less than that of the material forming the second layer 42 may be used to form the first layer 41 and any material that passes the light emitted from the organic layer 31 therethrough and has a refractive index greater than that of the material forming the first layer 41 may be used to form the second layer 42.

Figure 5:
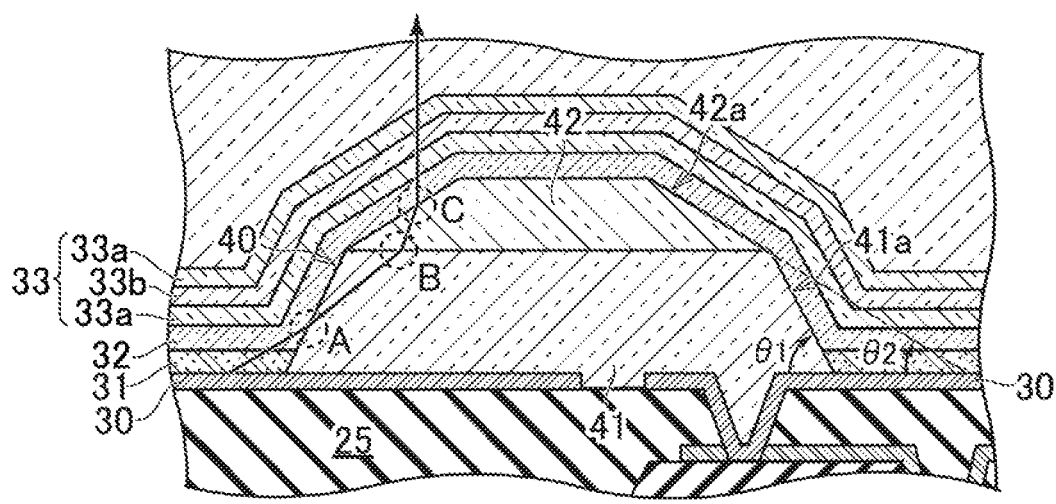
FIG. 5 is an enlarged view of a bank of an organic EL panel according to an embodiment of the present invention.

FIG. 5 is an enlarged view of the bank 40 of the organic EL display device 1 according to an embodiment of the present invention. In FIGS. 4 and 5, the light emitted from the organic layer 31 is schematically represented by the arrow. The light propagating in the first layer 41 is refracted at the point B at the interface between the first layer 41 and second layer 42 of the bank 40. As the refractive index of the material forming the first layer 41 is less than that of the material forming the second layer 42, the light is refracted at the point B toward the opposite side from the pixel electrode 30. That is, the light is refracted toward the display surface side of the organic EL panel 10. With the above, a part of the light emitted from the organic layer 31, the part emitted diagonally to the display surface will be refracted toward the display surface side at the interface between the first layer 41 and the second layer 42. This improves the light extraction efficiency.

The light emitted from the organic layer 31 is refracted at the point A at the interface between the opposed electrode 32 and the first layer 41 of the bank 40. The light refraction at the point A, although not significantly affected by the film thickness of the opposed electrode 32 as the film thickness is as small as or less than a light wavelength, is affected mainly by a difference in the refractive index between the sealing layer 33 and the first layer 41. The organic EL panel 10 according to this embodiment includes an inorganic insulating layer 33a formed on the opposed electrode 32 and an organic insulating layer 33b formed on the inorganic insulating layer 33a, in which the inorganic insulating layer 33a may be made of SiN and the organic insulating layer 33b may be made of acrylic resin. As the sealing layer 33 is formed using the inorganic insulating layer 33a and the organic insulating layer 33b, the organic layer 31 is well protected. This can produce an advantage of prolonging the service life of the organic EL panel 10.

A difference in the refractive index between the inorganic insulating layer 33a and the first layer 41 mainly affects the light refraction at the point A. Specifically, in the organic EL panel 10 according to this embodiment, as the refractive index of the material forming the inorganic insulating layer 33a is greater than that of the material forming the first layer 41, the light is refracted at the point A toward the opposite side from the pixel electrode 30. This enhances the light extraction efficiency. Note that in the case as well in which the refractive index of the material forming the inorganic insulating layer 33a is as high as that of the material forming the first layer 41, an advantage of improving the light extraction efficiency can be obtained when the refractive index of the material forming the first layer 41 is less than that of the material forming the second layer 42.

The light propagating in the second layer 42 is refracted at the point C at the interface between the second layer 42 of the bank 40 and the opposed electrode 32. The light refraction at the point C, although not significantly affected by the film thickness of the opposed electrode 32 as the film thickness is as small as or less than a light wavelength, is affected mainly by a difference in the refractive index between the inorganic insulating layer 33a and the second layer 42. In the organic EL panel 10 according to this embodiment, as the refractive index of the material forming the inorganic insulating layer 33a is greater than that of the material forming the second layer 42, the light is refracted at the point C toward the display surface side of the pixel electrode 30. This enhances the light extraction efficiency. Note that in the case as well in which the refractive index of the material forming the second layer 42 is as high as that of the material forming the inorganic insulating layer 33a, an advantage of improving the light extraction efficiency can be obtained when the refractive index of the material forming the first layer 41 is less than that of the material forming the second layer 42.

The interface between the first layer 41 and the second layer 42 of the bank 40 is formed in the direction along the upper surface of the pixel electrode 30. In the organic EL panel 10 according to this embodiment, the upper surface of the pixel electrode 30 is formed horizontal to the substrate 2, while the interface between the first layer 41 and the second layer 42 is formed in parallel with the upper surface of the pixel electrode 30. Although a part of the pixel electrode 30 is formed in a through-hole formed in the planarization film 25, the upper surface of the pixel electrode 30 refers to a flat portion thereof in contact with the organic layer 31 in this specification. According to the organic EL panel 10 according to this embodiment, formation of the interface between the first layer 41 and the second layer 42 in the direction along the upper surface of the pixel electrode 30 enables more efficient refraction of light toward the display surface side, while maintaining easiness in manufacturing of the bank 40.

The first layer 41 of the bank 40 has a first lateral wall 41a that defines a first angle θ1 relative to the upper surface of the pixel electrode 30. In the organic EL display device 1 according to this embodiment, the first lateral wall 41a is formed as a flat surface. The first angle θ1 is the angle at which the first lateral wall 41a contacts the pixel electrode 30. Meanwhile, the second layer 42 of the bank 40 has a second lateral wall 42a that defines a second angle θ2 relative to the upper surface of the pixel electrode 30. In the organic EL display device 1 according to this embodiment, the second lateral wall 42a is formed as a flat surface. The second angle θ2 is an angle defined by the extension line of the second lateral wall 42a and the pixel electrode 30. Alternatively, the first lateral wall 41a and the second lateral wall 42a may be formed as a curved surface. In this case, the first angel θ1 may be defined by the tangent line at the lower end of the first lateral wall 41a and the pixel electrode 30, while the second angle θ2 may be defined by the tangent line at the lower end of the second lateral wall 42a and the pixel electrode 30.

As the first angle θ1 is greater than the second angle θ2, the interface between the second layer 42 and the opposed electrode 32 inclines more toward the pixel electrode 30 side. This results in less light reflected toward the pixel electrode 30 side at the interface between the second layer 42 and the opposed electrode 32. This enhances the light extraction efficiency.

The first lateral wall 41a and the second lateral wall 42a are formed continuous to each other. That is, there is no step between the first lateral wall 41a and the second lateral wall 42a so that the first lateral wall 41a continuously shifts to the second lateral wall 42a. With the above, the light incident to the first layer 41 passes through the interface between the first layer 41 and the second layer 42 in most cases. This can enhance the light extraction efficiency.

Figure 6:
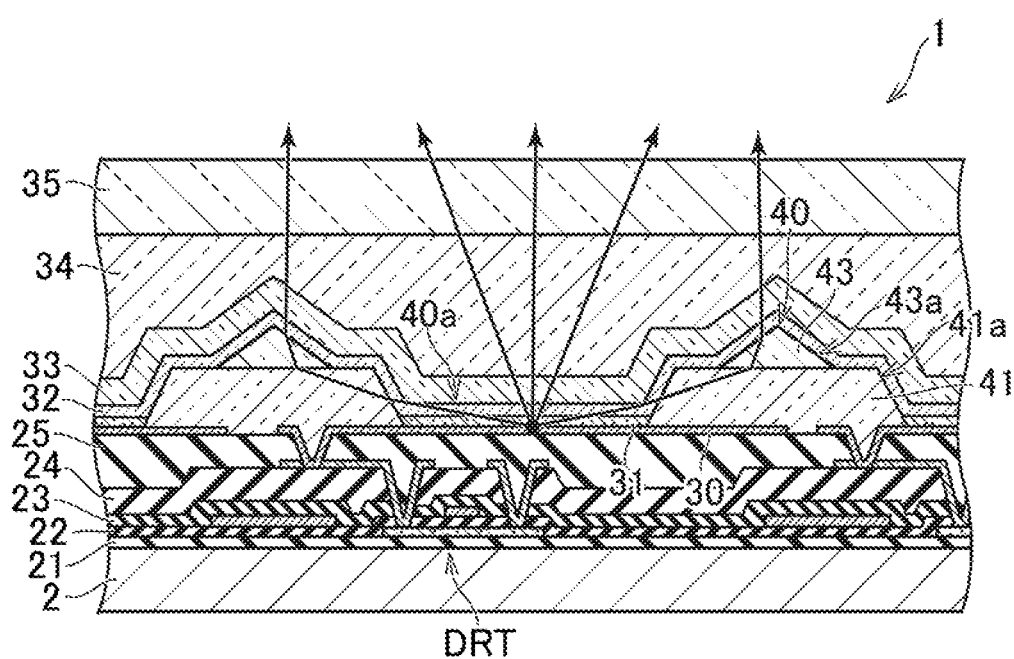
FIG. 6 is a cross sectional view of a pixel of an organic EL panel according to a modified example of an embodiment of the present invention.

FIG. 6 is a cross sectional view of a pixel of the organic EL display device 1 according to a modified example of an embodiment of the present invention. The organic EL display device 1 according to the modified example differs from the organic EL display device 1 shown in FIG. 4 in that the bank 40 has a modified second layer 43 formed on the first layer 41. The refractive index of the material forming the first layer 41 is less than that of the material forming the modified second layer 43. Structures other than the modified second layer 43 of the organic EL display device 1 according to the modified example are similar to those of the organic EL display device 1 shown in FIG. 4. In FIG. 6, the light emitted from the organic layer 31 is schematically represented by the arrow.

The first layer 41 of the bank 40 has the first lateral wall 41a that defines the first angle θ1 (not shown in FIG. 6) relative to the upper surface of the pixel electrode 30. The modified second layer 43 has a modified second lateral wall 43a that defines the second angle θ2 (not shown in FIG. 6) relative to the upper surface of the pixel electrode 30. In the organic EL display device 1 according to this embodiment, the modified second lateral wall 43a is formed as a flat surface. The second angle θ2 is the angle defined by the extension line of the modified second lateral wall 43a and the pixel electrode 30. As the first angle θ1 is greater than the second angle θ2, the interface between the modified second layer 43 and the opposed electrode 32 inclines more toward the pixel electrode 30 side. This results in less reflection of light toward the pixel electrode 30 side at the interface between the modified second layer 43 and the opposed electrode 32. This enhances the light extraction efficiency.

In this modified example, the first lateral wall 41a and the upper surface of the first layer 41 are continuous to each other, and the modified second lateral wall 43a, or the lateral wall of the modified second layer 43, and the upper surface of the first layer 41 are formed continuous to each other. That is, there is a step between the first lateral wall 41a and the modified second lateral wall 43a so that the first lateral wall 41a is formed connected to the modified second lateral wall 43a via the upper surface of the first layer 41. The modified second layer 43 is formed inside the area defined by the upper surface of the first layer 41. According to the organic EL display device 1 according to this modified example, the modified second layer 43 can be formed smaller as compared with the first layer 41. This facilitates formation of the modified second layer 43 made of material different from that of the first layer 41. This can achieve a display device that can be readily manufactured, while improving the light extraction efficiency.

While there have been described what are at present considered to be certain embodiments of the invention, it will be understood that various modifications may be made thereto, and it is intended that the appended claims cover all such modifications as fall within the true spirit and scope of the invention.

What is claimed is:
1. A display device, comprising:
a pixel electrode formed on an insulating surface;
a bank covering an end portion of the pixel electrode and having an opening formed therein in which an upper surface of the pixel electrode is exposed;
an organic layer containing a light emitting layer and formed covering the opening; and
an opposed electrode formed on the organic layer and the bank, wherein the bank has a first layer formed on an end portion of the pixel electrode and the insulating surface, and a second layer formed on the first layer, a refractive index of material forming the first layer is less than a refractive index of material forming the second layer, the first layer has a first lateral wall that defines a first angle relative to the upper surface of the pixel electrode, the second layer has a second lateral wall that defines a second angle relative to the upper surface of the pixel electrode, and the first angle is greater than the second angle.

2. The display device according to claim 1, wherein an interface between the first layer and the second layer is formed in a direction along the upper surface of the pixel electrode.

3. The display device according to claim 1, wherein the first lateral wall and the second lateral wall are formed continuous to each other.

4. The display device according to claim 1, wherein
an upper surface of the first layer is formed continuous to the first lateral wall, and
the second lateral wall is formed continuous to the upper surface of the first layer.

5. The display device according to claim 1, further comprising:
an inorganic insulating film formed on the opposed electrode; and
an organic insulating film formed on the inorganic insulating film.

6. The display device according to claim 5, wherein a refractive index of material forming the inorganic insulating film is greater than a refractive index of material forming the first layer.

7. The display device according to claim 5, wherein a refractive index of material forming the inorganic insulating film is greater than a refractive index of material forming the second layer.

8. A display device, comprising:
a pixel electrode formed on an insulating surface;
a bank covering an end portion of the pixel electrode and having an opening formed therein in which an upper surface of the pixel electrode is exposed;
an organic layer containing a light emitting layer and formed covering the opening; and
an opposed electrode formed on the organic layer and the bank, wherein the bank has a first layer formed on an end portion of the pixel electrode and the insulating surface, and a second layer formed on the first layer,
the first layer has a first lateral wall that defines a first angle relative to the upper surface of the pixel electrode,
the second layer has a second lateral wall that defines a second angle relative to the upper surface of the pixel electrode, and
the first angle is greater than the second angle.

9. The display device according to claim 8, wherein
an interface between the first layer and the second layer is formed in a direction along the upper surface of the pixel electrode.

10. The display device according to claim 8, wherein
the first lateral wall and the second lateral wall are formed continuous to each other.

11. The display device according to claim 8, wherein
an upper surface of the first layer is formed continuous to the first lateral wall, and
the second lateral wall is formed continuous to the upper surface of the first layer.

12. The display device according to claim 8, further comprising:
an inorganic insulating film formed on the opposed electrode; and
an organic insulating film formed on the inorganic insulating film.

13. The display device according to claim 12, wherein
a refractive index of material forming the inorganic insulating film is greater than a refractive index of material forming the first layer.

14. The display device according to claim 12, wherein
a refractive index of material forming the inorganic insulating film is greater than a refractive index of material forming the second layer.

* * * * *